(12) United States Patent
Briggs et al.

(10) Patent No.: US 9,560,748 B2
(45) Date of Patent: Jan. 31, 2017

(54) FLEXIBLE PRINTED CIRCUIT

(71) Applicants: Drew Stone Briggs, Jamaica Plain, MA (US); Scott C. Perzanoski, Dudley, MA (US)

(72) Inventors: Drew Stone Briggs, Jamaica Plain, MA (US); Scott C. Perzanoski, Dudley, MA (US)

(73) Assignee: Bose Corporation, Framingham, MA (US)

( * ) Notice: Subject to any disclaimer, the term of this patent is extended or adjusted under 35 U.S.C. 154(b) by 682 days.

(21) Appl. No.: 13/734,189

(22) Filed: Jan. 4, 2013

(65) Prior Publication Data
US 2014/0190729 A1    Jul. 10, 2014

(51) Int. Cl.
*H05K 1/02*    (2006.01)
*H05K 3/46*    (2006.01)

(52) U.S. Cl.
CPC ............ *H05K 1/028* (2013.01); *H05K 1/0225* (2013.01); *H05K 1/0218* (2013.01); *H05K 1/0298* (2013.01); *H05K 3/4617* (2013.01); *H05K 3/4635* (2013.01); *H05K 2201/0715* (2013.01); *H05K 2201/09681* (2013.01); *H05K 2201/2009* (2013.01); *Y10T 156/10* (2015.01); *Y10T 156/1043* (2015.01)

(58) Field of Classification Search
CPC .............................. H05K 1/0225; H05K 1/028
USPC ........................................................ 174/254
See application file for complete search history.

(56) References Cited

U.S. PATENT DOCUMENTS

| | | | |
|---|---|---|---|
| 3,612,744 A * | 10/1971 | Thomas | H01B 11/20 174/117 FF |
| 5,219,640 A | 6/1993 | Gazit et al. | |
| 5,723,205 A | 3/1998 | Millette et al. | |
| 5,981,870 A * | 11/1999 | Barcley | H05K 1/0224 174/254 |
| 6,099,745 A | 8/2000 | McKenney et al. | |
| 6,293,008 B1 | 9/2001 | Schmidt et al. | |
| 6,737,589 B2 | 5/2004 | Adachi et al. | |
| 8,188,372 B2 | 5/2012 | Sato et al. | |
| 8,247,699 B2 | 8/2012 | Shen | |
| 2004/0094324 A1* | 5/2004 | Barr et al. | 174/117 F |
| 2007/0202307 A1 | 8/2007 | Oh et al. | |
| 2008/0062658 A1 | 3/2008 | Oowaki | |
| 2008/0144295 A1* | 6/2008 | Wang et al. | 361/750 |
| 2010/0252307 A1 | 10/2010 | Mo | |

FOREIGN PATENT DOCUMENTS

| | | |
|---|---|---|
| GB | 746936 A | 3/1956 |
| JP | 06326426 A | 11/1994 |

OTHER PUBLICATIONS

International Search Report and Written Opinion dated Mar. 20, 2014 for International application No. PCT/US2013/075627.

* cited by examiner

*Primary Examiner* — Jenny L Wagner
*Assistant Examiner* — Michael E Moats, Jr.

(57) ABSTRACT

A flexible printed circuit includes a first insulating substrate layer and a first electrically conductive layer located adjacent to a first side of the insulating substrate layer. The first conductive layer has a first portion that is substantially solid and a second portion having a multiplicity of voids in the first conductive layer in a pattern for providing a lower stiffness in the second portion relative to the first portion, thereby providing more flexibility in the second portion relative to the first portion.

13 Claims, 7 Drawing Sheets

FLEXIBLE PRINTED CIRCUIT

BACKGROUND

This disclosure relates to a flexible printed circuit which is a lamination of layers of a flexible plastic substrate and electrically conductive circuits (traces). The lamination may also include one or more shielding layers to resist electromagnetic radiation from traveling between the traces and an environment external to the flexible printed circuit. This technology allows flexible printed circuits to more easily conform to a desired shape (or to flex), reduce a product's size, and supply consistent circuit routing.

SUMMARY

In one aspect, a flexible printed circuit includes a first insulating substrate layer and a first electrically conductive layer located adjacent to a first side of the insulating substrate layer. The first conductive layer has a first portion that is substantially solid and a second portion having a multiplicity of voids in the first conductive layer in a pattern for providing a lower stiffness in the second portion relative to the first portion, thereby providing more flexibility in the second portion relative to the first portion.

Embodiments may include one or more of the following features. The flexible printed circuit may further include a second electrically conductive layer having a plurality of electrically conductive traces for conducting one or more of electrical signals and electrical power from a first part of the flexible printed circuit to a second part of the flexible printed circuit. The second conductive layer may be located adjacent to a second side of the insulating substrate layer. The first electrically conductive layer may include a plurality of electrically conductive traces for conducting one or more of electrical signals and electrical power from a first part of the flexible printed circuit to a second part of the flexible printed circuit. The first conductive layer may be made of copper. An adhesive layer may be located between the first conductive layer and the insulating layer. An adhesive layer may be located between the second conductive layer and the insulating layer. The voids may each have a cross-section that is substantially square in shape. The first conductive layer may resist electromagnetic radiation from traveling between the traces and an environment external to the flexible printed circuit.

The flexible printed circuit may further include (i) a second insulating layer, the first conductive layer being located adjacent to a first side of the second insulating layer; and (ii) a third electrically conductive layer located adjacent to a second side of the second insulating layer, the third conductive layer having a first portion that is substantially solid and a second portion having a multiplicity of voids in the third conductive layer in a pattern for providing a lower stiffness in the second portion of the third conductive layer relative to the first portion of the third conductive layer, thereby providing more flexibility in the second portion of the third conductive layer relative to the first portion of the third conductive layer.

In another aspect, a method of manufacturing a flexible printed circuit includes providing an insulating layer and supplying a first electrically conductive layer with a plurality of electrically conductive traces which will be used to conduct one or more of electrical signals and electrical power from a first portion of the flexible printed circuit to a second portion of the flexible printed circuit. The first conductive layer is secured adjacent to a first side of the insulating layer. A substantially solid second electrically conductive layer having a first portion and a second portion is supplied. A multiplicity of voids are created in the second portion of the conductive layer in a pattern for providing a lower stiffness in the second portion relative to the first portion. The second conductive layer is secured adjacent to a second side of the insulating layer, thereby controlling the flexibility of the flexible printed circuit.

Embodiments may include any of the above features and/or the following. A second portion of the flexible printed circuit that includes the second portion of the second conductive layer may be bent relative to a first portion of the flexible printed circuit that includes the first portion of the second conductive layer, such that at least part of each of the first and second portions of the flexible printed circuit are located in different planes. The voids may have a cross-section that is substantially square in shape. The second conductive layer may resist electromagnetic radiation from traveling between the traces and an environment external to the flexible printed circuit. The insulating layer may include polyimide.

In another aspect, an electrical apparatus that includes a flexible printed circuit has a first electrically conductive layer with a plurality of electrically conductive traces for conducting one or more of electrical signals and electrical power from a first portion of the flexible printed circuit to a second portion of the flexible printed circuit. The first conductive layer is located adjacent to a first side of a first insulating layer. A second electrically conductive layer is located adjacent to a second side of the insulating layer. The second conductive layer has a first portion that is substantially solid and a second portion having a multiplicity of voids in the conductive layer in a pattern for providing a lower stiffness in the second portion relative to the first portion. A second portion of the flexible printed circuit includes the second portion of the second conductive layer being bent relative to a first portion of the flexible printed circuit that includes the first portion of the second conductive layer. As such, the first and second portions of the flexible printed circuit are located in different planes.

Embodiments may include any of the above features and/or the following. The voids have a cross-section that is substantially square in shape. The second conductive layer resists electromagnetic radiation from traveling between the traces and an environment external to the flexible printed circuit. A first adhesive layer is located between the first conductive layer and the insulating layer. A second adhesive layer is located between the second conductive layer and the insulating layer. The flexible printed circuit can further include a second insulating layer. The first conductive layer can be located adjacent to a first side of the second insulating layer. A third electrically conductive layer can be located adjacent to a second side of the second insulating layer. The third conductive layer can have a first portion that is substantially solid and a second portion having a multiplicity of voids in the third conductive layer in a pattern for providing a lower stiffness in the second portion of the third conductive layer relative to the first portion of the third conductive layer. The second portion of the flexible printed circuit includes the second portion of the third conductive layer being bent relative to the first portion of the flexible printed circuit that includes the first portion of the third conductive layer.

DETAILED DESCRIPTION

The description below refers to a flexible printed circuit with a conductive layer having a plurality of electrically conductive traces. There are conductive shielding layers located on either side of the traces. In some sections of the shielding layers portions are removed to leave a pattern of voids in these sections. As a result, these sections of the shielding layers are more flexible, thus allowing the flexible printed circuit to be more easily bent during a manufacturing process in which the flexible printed circuit is assembled into a product such as a communications headset.

Figure 1A:
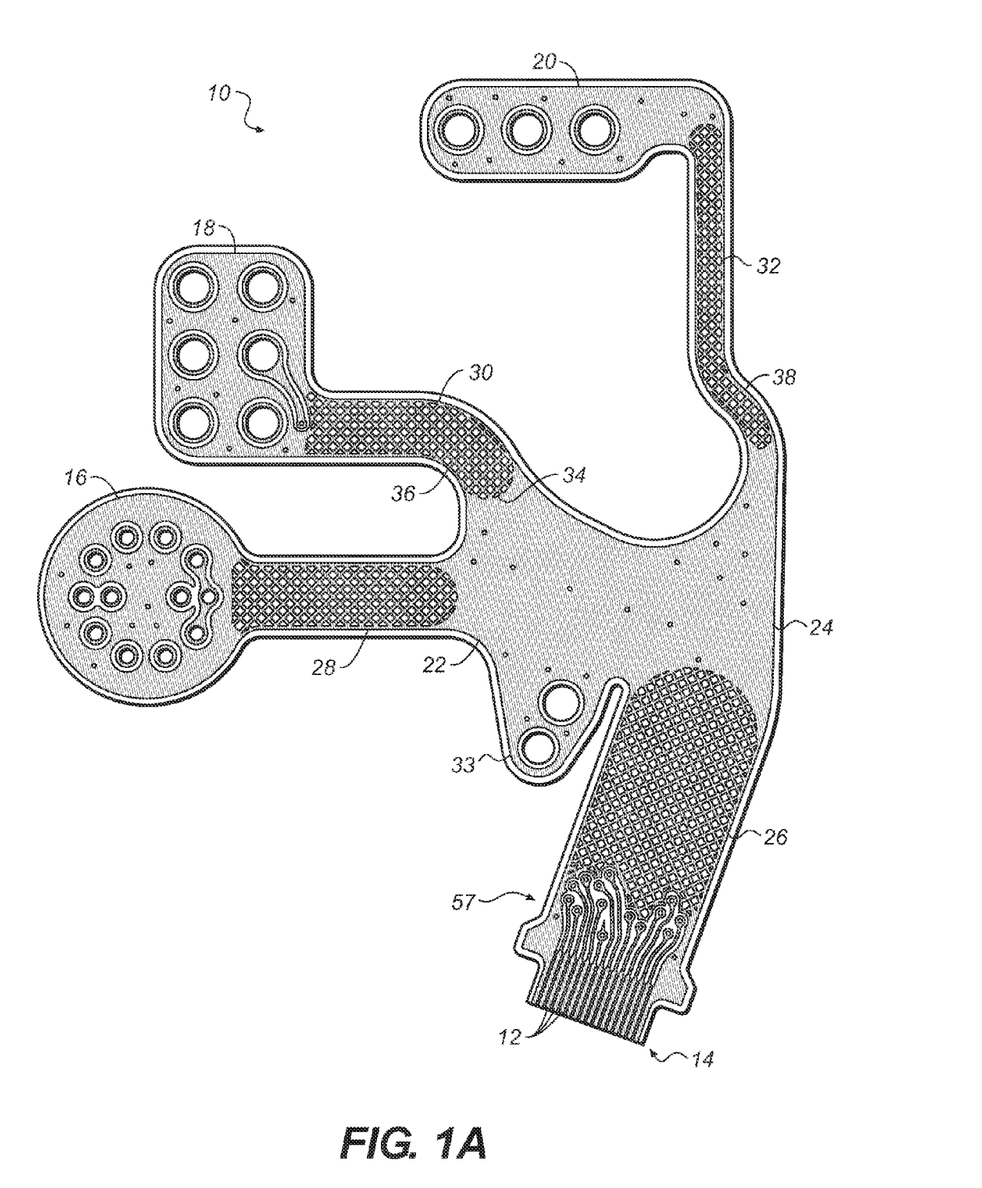
FIGS. 1A-C show three conductive layers of a flexible printed circuit.

Referring to FIG. 1A, a flexible printed circuit 10 includes a top electrically conductive shielding layer 22 with a plurality of electrically conductive copper leads 12 located at a first part 14 of the flexible printed circuit 10. The shielding layer 22 preferably extends across most or all of the flexible printed circuit 10 and is preferably made of copper. The shielding layer 22 has a first portion 24 where the conductive layer is substantially solid and other portions 26, 28 30 and 32 where the shielding layer has a multiplicity of voids. These voids are in a pattern that provides a lower stiffness in the portions 26, 28, 30 and 32 relative to the first portion 24, thereby providing more flexibility in portions 26, 28, 30 and 32 relative to the first portion 24.

The series of voids in portions 26, 28, 30 and 32 are in a cross-hatch pattern similar to a lattice. Each void in this example has a cross-section (as viewed in FIG. 1A) that is substantially square in shape. The voids could have a different cross-section (e.g. round). Each square void (as viewed in FIG. 1A) is about 0.5 mm×0.5 mm. The distance between adjacent sides of respective adjacent squares is about 0.2 mm (this is also the width of each section of remaining material in the shielding layer 22). The voids extend across substantially the entire width of portions 26, 28, 30 and 32. A transition (e.g. a transition 34) between portion 24 and each of the portions 26, 28, 30 and 32 of the conductive layer has a substantially curvilinear shape. A part 33 of the flexible printed circuit 10 includes two relatively large circular features which are used in securing the flexible printed circuit to a product during assembly. For example, a post (not shown) may be passed through one circular feature and a screw (not shown) may be passed through the other circular feature and secured to the product.

Figure 1B:
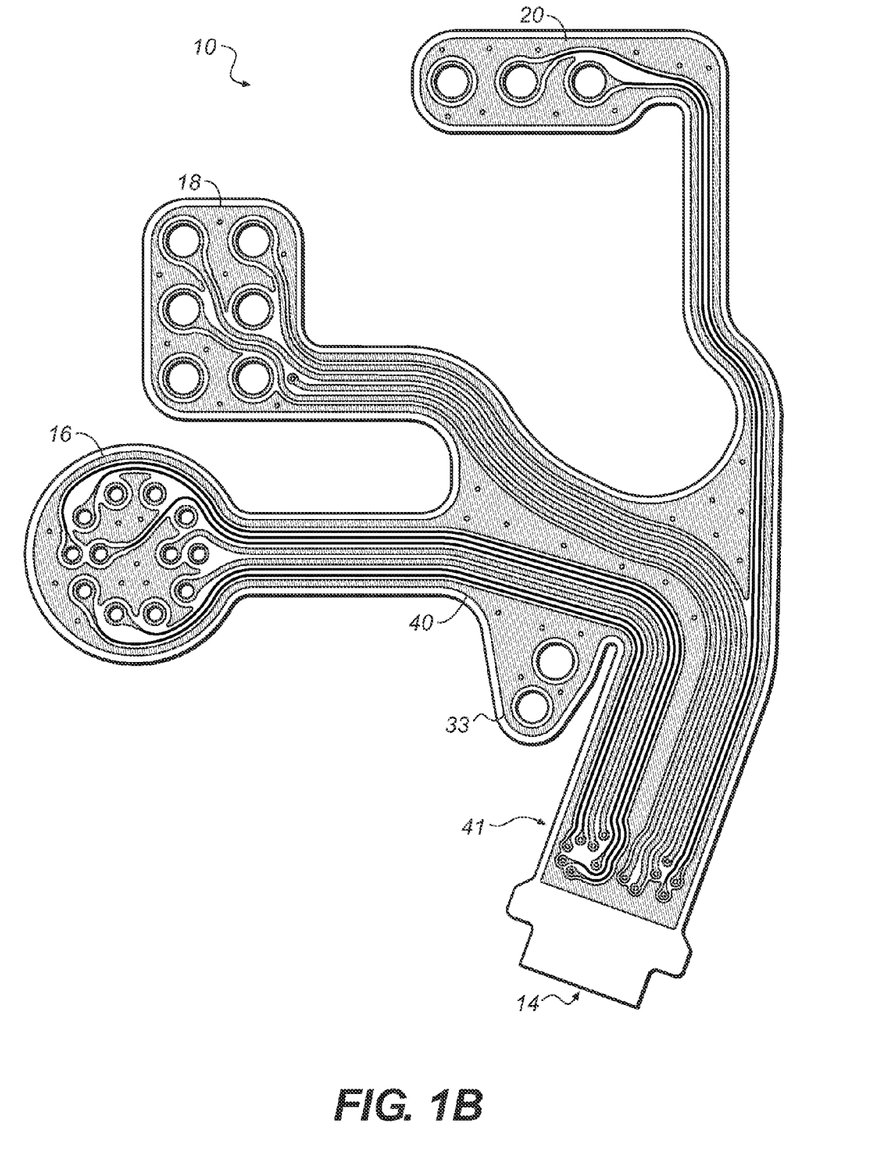

Turning to FIG. 1B, a middle electrically conductive layer 40 includes a plurality of electrically conductive traces 41 for conducting one or more of electrical signals and electrical power from the first part 14 of the flexible printed circuit 10 to the other parts 16, 18 and 20 (also shown in FIG. 1A) of the flexible printed circuit 10. These traces and the layer 40 are typically made of copper. The traces 41 are electrically connected to the conductive leads 12 (FIG. 1A). The layer 40 has a substantially similar shape to the layer 22. The circular features in parts 16, 18 and 20 of the flexible printed circuit 10 are electrical contact locations for electrically connecting the flexible printed circuit 10 to other electrical components.

Referring to FIGS. 1A and 1B, the cross-hatch pattern is preferably oriented such that the remaining conductive material in the cross-hatch pattern is not parallel with the conductive traces. This is the case in portions 26 and 28. This results in all of the material in the cross-hatch pattern bending to accept the stresses imposed by bending the flexible printed circuit 10. There are minor areas 36 and 38 in portions 30 and 32 in which some of the remaining conductive material in the cross-hatch pattern is parallel or perpendicular with the conductive traces (this is due to the curved arrangement of portions 30 and 32). Conductive material in the cross-hatch pattern that is perpendicular to the traces tends to not bend when the flexible printed circuit 10 is locally bent, and thus does not absorb substantially any of the bending stresses. However, areas 36 and 38 are preferably only bent during assembly, but are not bent in the final configuration of the flexible printed circuit.

Figure 1C:
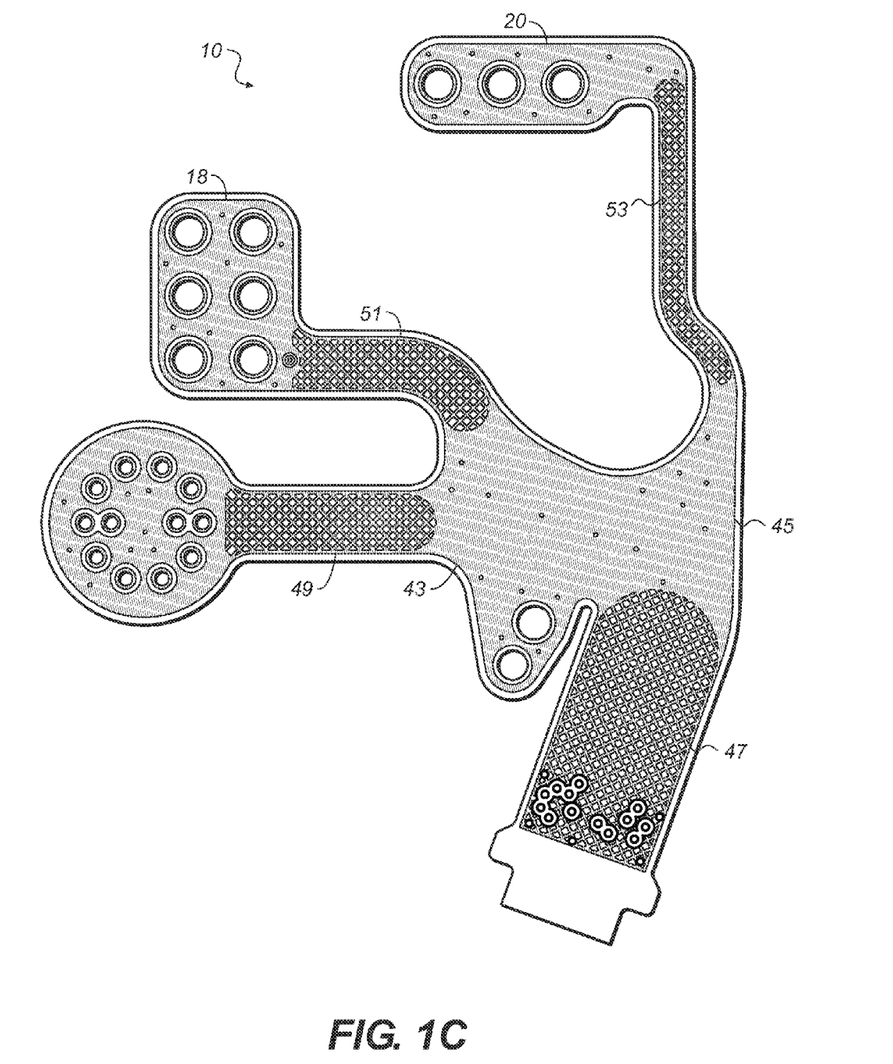

Referring to FIG. 1C, the flexible printed circuit 10 includes a bottom electrically conductive shielding layer 43 that preferably extends across most or all of the flexible printed circuit 10 and is preferably made of copper. The shielding layer 43 has a first portion 45 where the conductive layer is substantially solid and other portions 47, 49, 51 and 53 where the shielding layer has a multiplicity of voids. These voids are in a pattern that provides a lower stiffness in the portions 47, 49, 51 and 53 relative to the first portion 45, thereby providing more flexibility in portions 47, 49, 51 and 53 relative to the first portion 45. The pattern of voids are preferably substantially similar to the pattern of voids shown in FIG. 1A. Each void in FIG. 1C preferably has substantially the same characteristics as each of the voids shown in FIG. 1A. Layer 22 is located above layer 40 and layer 43 is located below layer 22. The pattern of voids in layer 22 and 43 are preferably substantially aligned with each other in the flexible printed circuit 10.

Figure 2:
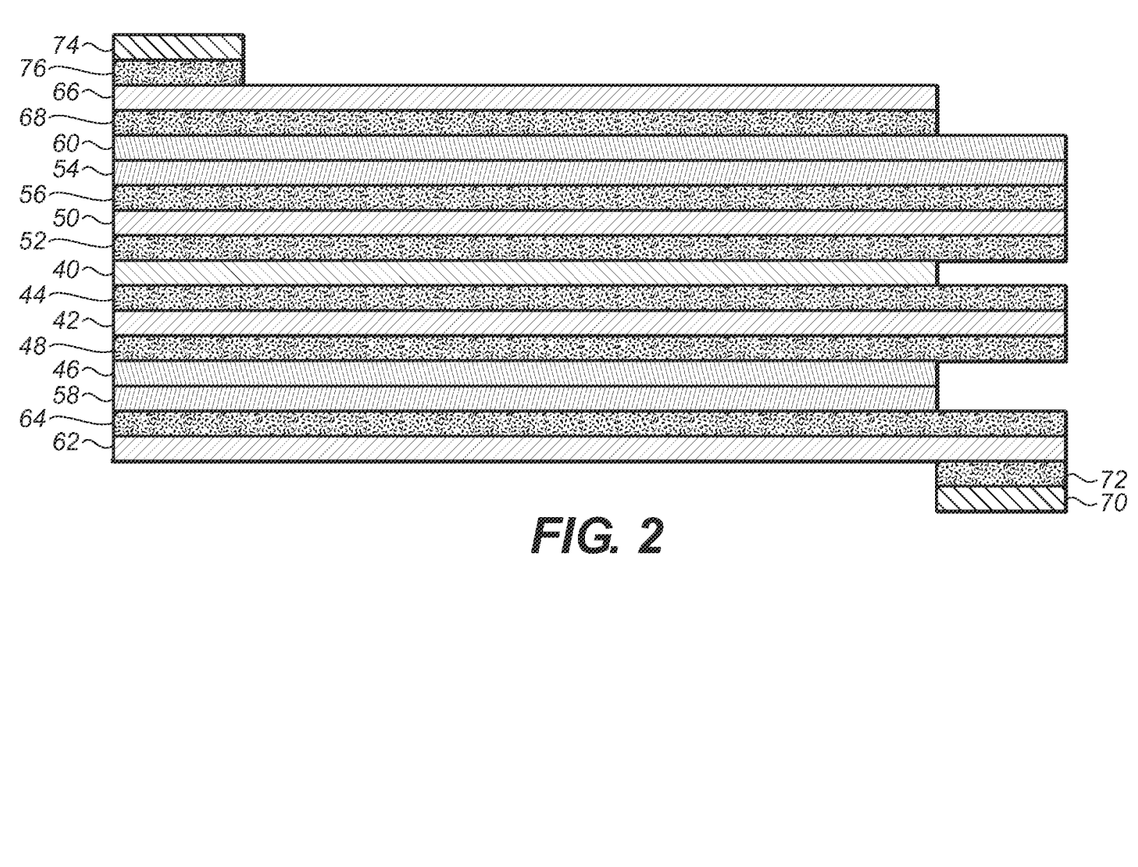
FIG. 2 is a cross-sectional view of the various layers that are in a flexible printed circuit that includes the conductive layers of FIG. 1.

Turning to FIG. 2, the flexible printed circuit 10 includes a number of layers and may be manufactured in the following manner. A 25 µm thick polyimide layer 42 is provided. An 18 µm thick RA copper layer 40 is secured to the polyimide layer 42 with an 18 µm thick thermal adhesive layer 44. The conductive traces 41 and other features of the layer 40 (FIG. 1B) are then made by acid etching away some of the copper layer 40 (adhesive layer 44 is between the layer 40 and the layer 42). The traces 41 are located adjacent to a first side of the polyimide layer 42. Another 18 µm thick substantially solid electrically conductive copper layer 46 is secured and located adjacent to a second side of the polyimide layer 42 with a thermal adhesive layer 48 (adhesive layer 48 is between the layer 46 and the layer 42). A multiplicity of square voids in a cross-hatch pattern like those described above (as well as other features in FIG. 1C) are acid etched into portions 47, 49, 51 and 53 (FIG. 1C) of the copper layer 46.

A 25 µm thick polyimide layer 50 is secured to the copper layer 40 with an 18 µm thick thermal adhesive layer 52. The traces 41 are located adjacent to a first side of the polyimide layer 50. A still further 18 µm thick RA copper layer 54 is secured to and adjacent to a second side of the polyimide layer 50 with an 18 µm thick thermal adhesive layer 56. A multiplicity of square voids in a cross-hatch pattern like those described above (as well as other features in FIG. 1A) are acid etched into the copper layer 54. The voids in layers 46 and 54 are aligned with each other in a direction perpendicular to the direction in which the layers extend.

Any required vias (e.g., at location 57 in FIG. 1A) required are drilled into the stacked up layers. As an alternative to using adhesive to secure a conductive layer to an insulating layer, the conductive layer can be deposited directly onto the insulating layer (e.g. by electro-deposition), thereby eliminating the adhesive.

Additional 25 µm thick copper layers 58 and 60 are plated (e.g. chemically or electrically) onto the remaining copper in the copper layers 46 and 54 respectively. These 4 copper layers resist electromagnetic radiation from traveling between the traces 12 and an environment external to the flexible printed circuit. Copper layers 46 and 58 form the bottom electrically conductive shielding layer 43 (FIG. 1C) mentioned above. Copper layers 54 and 60 form the top electrically conductive shielding layer 22 mentioned above that is visible in FIG. 1A. Top and bottom cover layers are pre-drilled (or punched). A bottom cover layer of a 25 µm thick polyimide layer 62 is secured to the copper layer 58 with a 35 µm thick thermal adhesive layer 64. A top cover layer of a 25 µm thick polyimide layer 66 is secured to the copper layer 60 with a 35 µm thick thermal adhesive layer 68.

A 50 µm thick polyimide (PI) stiffener layer 70 is secured to the polyimide layer 62 with a 35 µm thick layer 72 of a thermal adhesive. The PI layer is preferably only located on the first part 14 of the flexible printed circuit 10 (FIG. 1A) where the flexible printed circuit 10 will be electrically connected to another device. A 1500 µm thick fiberglass reinforced thermoset epoxy laminate FR4 stiffener layer 74 is secured to the polyimide layer 66 with a 35 µm thick layer 76 of a thermal adhesive. The FR4 layer is preferably only located on the parts 16, 18 and 20 of the flexible printed circuit 10 (FIG. 1A) where the flexible printed circuit 10 will be electrically connected to other devices (e.g. switches). All of the thermal adhesive layers are activated by thermally pressing the stacked up layers. The adhesive and polyimide layers are semi-transparent and are electrically insulating.

Figure 3:
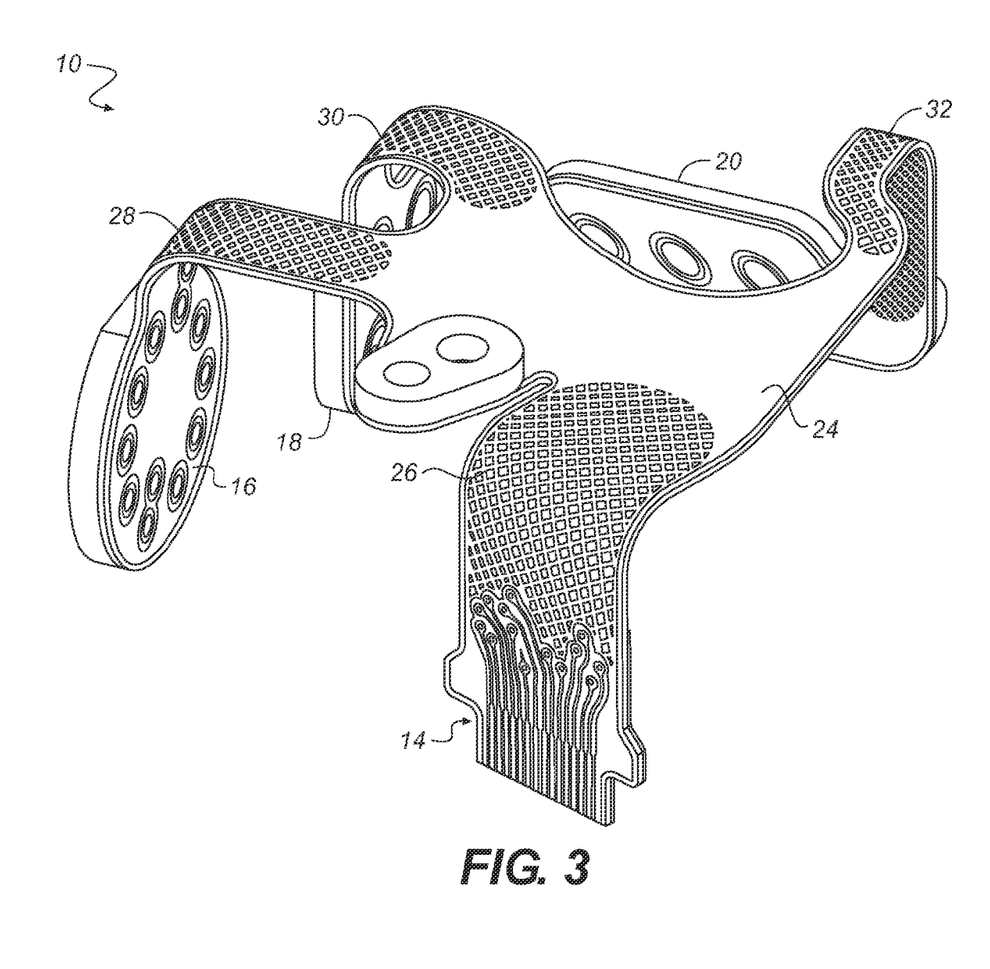
FIG. 3 is a perspective view of a flexible printed circuit including the conductive layers of FIG. 1 with portions of the flexible printed circuit bent.
Figure 4:
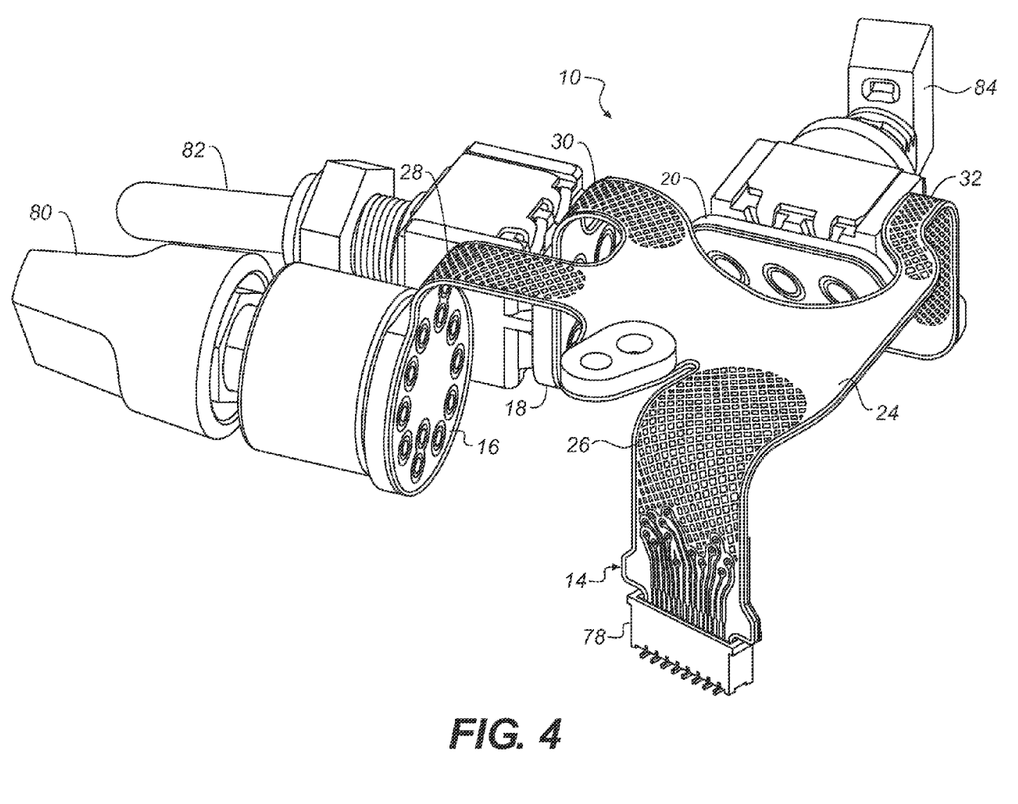
FIG. 4 is a perspective view of the flexible printed circuit of FIG. 3 with portions of the flexible printed circuit connected to electrical components.

Referring to FIGS. 3 and 4, the portions 26, 28, 30 and 32 of the flexible printed circuit 10 have been bent relative to the part 14 of the flexible printed circuit. As the portions 26, 28, 30 and 32 are more flexible than other portions of the flexible printed circuit 10, there is less force required to bend portions 26, 28, 30 and 32 during assembly. In addition, there is less residual stress in the portions 26, 28, 30 and 32 in their bent position due to the voids in these portions of the flexible printed circuit 10.

During the bending process areas 36 and 38 (FIG. 1A) are temporarily bent while manipulating the flexible printed circuit 10 into its final assembled position (FIGS. 3 and 4) as part of a larger product. The areas 36 and 38 are not substantially bent when the flexible printed circuit 10 is in the final assembled position At least part of the portion 24 of the flexible printed circuit 10 is located in a different plane from at least part of each of the portions 26, 28, 30 and 32 of the flexible printed circuit 10. Part 14 of the flexible printed circuit 10 is connected to an electrical component such as a connector 78. Parts 16, 18 and 20 of the flexible printed circuit 10 are connected to other electrical components such as respective switches 80, 82 and 84.

Figure 5:
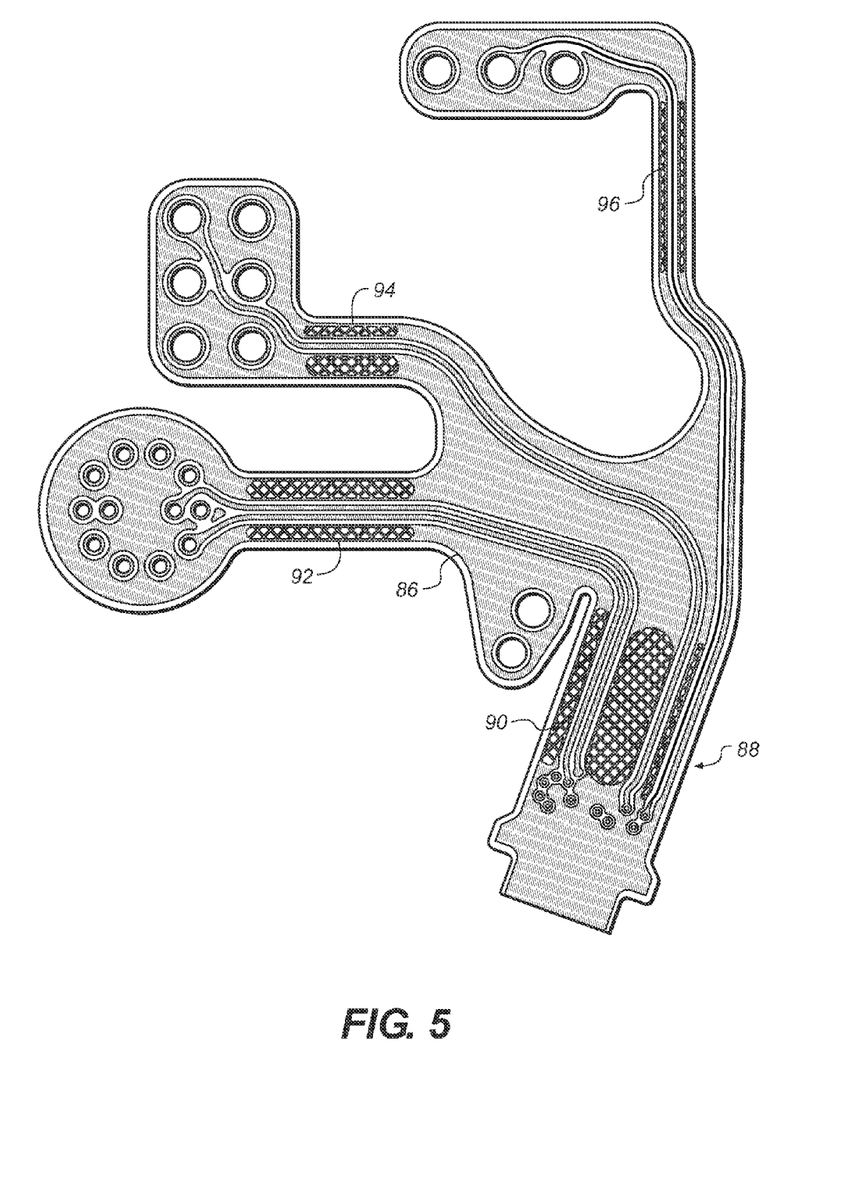
FIG. 5 shows another embodiment of a conductive layer for a flexible printed circuit.

Turning to FIG. 5, another embodiment of a conductive layer 86 is provided that includes both conductive traces 88 and portions 90, 92, 94 and 96 that each include voids as described above. A reason for having a single layer containing both traces and controlled stiffness elements is to create a more flexible, simpler, and more cost effective flexible printed circuit when electromagnetic shielding is not necessary.

A number of implementations have been described. Nevertheless, it will be understood that additional modifications may be made without departing from the spirit and scope of the inventive concepts described herein, and, accordingly, other embodiments are within the scope of the following claims.

What is claimed is:

1. A flexible printed circuit, comprising:
   a first insulating substrate layer;
   a top electrically conductive shielding layer located adjacent to a first side of the first insulating substrate layer, the top electrically conductive shielding layer having a first portion that is substantially solid and a second portion having a multiplicity of voids in a pattern for providing a lower stiffness in the second portion relative to the first portion, thereby providing more flexibility in the second portion relative to the first portion;
   a middle electrically conductive layer comprising a plurality of electrically conductive traces for conducting one or more of electrical signals and electrical power from a first part of the flexible printed circuit to a second part of the flexible printed circuit, the middle conductive layer being located adjacent to a second side of the first insulating substrate layer;
   a second insulating layer, the middle electrically conductive layer being located adjacent to a first side of the second insulating layer; and
   a bottom electrically conductive shielding layer located adjacent to a second side of the second insulating layer, the bottom electrically conductive shielding layer having a first portion that is substantially solid and a second portion having a multiplicity of voids in a pattern for providing a lower stiffness in the second portion of the bottom electrically conductive shielding layer relative to the first portion of the bottom electrically conductive shielding layer, thereby providing more flexibility in the second portion of the bottom electrically conductive shielding layer relative to the first portion of the bottom electrically conductive shielding layer,
   wherein the sections between adjacent voids in the top electrically conductive shielding layer and bottom electrically conductive shielding layer are substantially solid, and when the top electrically conductive shielding layer, middle conductive layer, and bottom electrically conductive shielding layer are stacked in a vertical configuration, the sections in each of the shielding layers are oriented such that they are not parallel to the conductive traces of the middle conductive layer.

2. The flexible printed circuit of claim 1, wherein the top electrically conductive shielding layer comprises a plurality of electrically conductive leads for conducting one or more of electrical signals and electrical power to the electrically conductive traces.

3. The flexible printed circuit of claim 1, wherein the top electrically conductive shielding layer is made of copper.

4. The flexible printed circuit of claim 1, wherein an adhesive layer is located between the top electrically conductive shielding layer and the first insulating substrate layer.

5. The flexible printed circuit of claim 1, wherein an adhesive layer is located between the middle electrically conductive layer and the first insulating substrate layer.

6. The flexible printed circuit of claim 1, wherein the voids of the top and bottom electrically conductive shielding layers each have a cross-section that is substantially square in shape.

7. The flexible printed circuit of claim 1, wherein the top and bottom electrically conductive shielding layers resist electromagnetic radiation from traveling between the traces and an environment external to the flexible printed circuit.

8. The flexible printed circuit of claim 1, further comprising a first transition region between the first and second portion of the top electrically conductive shielding layer and a second transition region between the first and second portion of the bottom electrically conductive shielding layer, wherein the first and second transition regions are substantially curvilinear in shape.

9. The flexible printed circuit of claim 6, wherein the voids of the top and bottom electrically conductive shielding layers are approximately 0.5 mm by 0.5 mm in size.

10. The flexible printed circuit of claim 9, wherein the distance between adjacent voids in the top and bottom electrically conductive shielding layers is approximately 0.2 mm.

11. The flexible printed circuit of claim 1, wherein the voids of the top electrically conductive shielding layer extend across substantially the entire second portion of the top electrically conductive shielding layer.

12. The flexible printed circuit of claim 1, wherein the voids of the bottom electrically conductive shielding layer extend across substantially the entire second portion of the bottom electrically conductive shielding layer.

13. The flexible printed circuit of claim 1 wherein the pattern of voids in the top electrically conductive shielding layer and the pattern of voids in the bottom electrically conductive shielding layer are substantially aligned when the top electrically conductive shielding layer, middle conductive layer, and bottom electrically conductive shielding layer are stacked in a vertical configuration.

* * * * *